(12) United States Patent
Asano et al.

(10) Patent No.: US 6,540,509 B2
(45) Date of Patent: Apr. 1, 2003

(54) HEAT TREATMENT SYSTEM AND METHOD

(75) Inventors: Takanobu Asano, Shiroyama-Machi (JP); Katsutoshi Ishii, Shiroyama-Machi (JP); Hiroyuki Yamamoto, Shiroyama-Machi (JP); George Hoshi, Shiroyama-Machi (JP); Kazutoshi Miura, Shiroyama-Machi (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/867,564

(22) Filed: May 31, 2001

(65) Prior Publication Data

US 2001/0049080 A1 Dec. 6, 2001

(30) Foreign Application Priority Data

May 31, 2000 (JP) ........................ 2000-162769
May 31, 2000 (JP) ........................ 2000-163002

(51) Int. Cl.⁷ ................................ F27B 5/00
(52) U.S. Cl. ................. 432/205; 432/152; 432/200
(58) Field of Search ................. 432/152, 205, 432/241, 120, 200; 118/715, 724, 725; 219/390; 438/773, 787

(56) References Cited

U.S. PATENT DOCUMENTS

| 5,777,300 A | * | 7/1998 | Homma et al. ........... 118/715 |
| 5,785,762 A | * | 7/1998 | Masuda .................. 118/666 |
| 6,297,172 B1 | * | 10/2001 | Kashiwagi ............... 438/773 |

FOREIGN PATENT DOCUMENTS

| JP | 6-196422 | 7/1994 |
| JP | 7-193059 | 7/1995 |
| JP | 2000-183055 | 6/2000 |

* cited by examiner

Primary Examiner—Jiping Lu
(74) Attorney, Agent, or Firm—Smith, Gambrell & Russell, LLP

(57) ABSTRACT

The present invention relates generally to a heat treatment system and method for heat-treating an object to be treated. Particularly, the invention relates to a heat treatment system wherein an object to be treated is carried in a reaction vessel, which has been pressure-reduced to a predetermined degree of vacuum and the interior of which is heated to a predetermined process temperature, and a process gas is supplied into the reaction vessel via a gas feed passage to process the object.

12 Claims, 11 Drawing Sheets

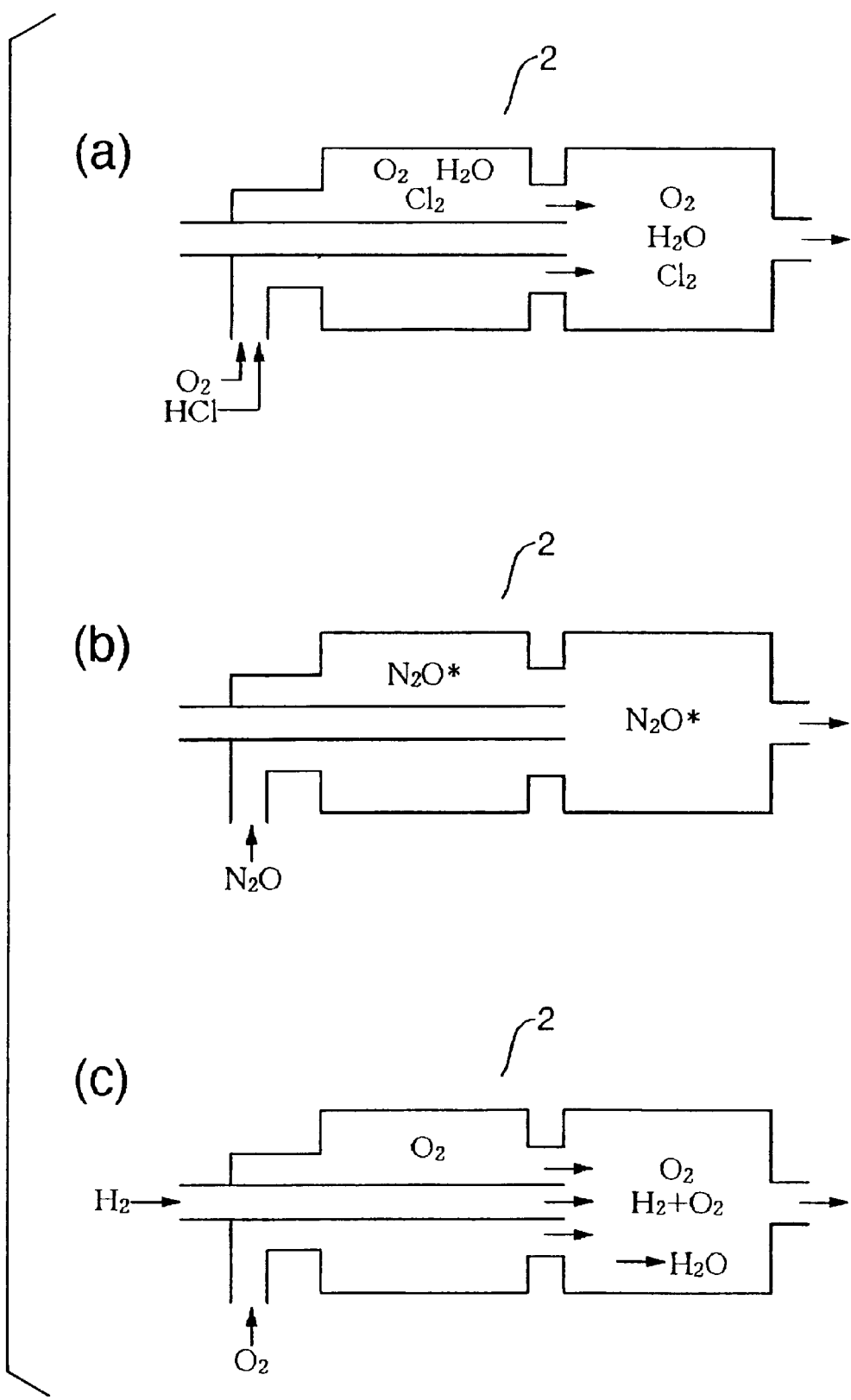
F I G. 4

HEAT TREATMENT SYSTEM AND METHOD

BACKGROUND OF THE INVENTION

1. Field of The Invention

The present invention relates generally to a heat treatment system and method for heat-treating an object to be treated.

2. Description of Related Art

First, the art related to a first invention provided by the present application will be described below.

As methods for carrying a large number of semiconductor wafers (which will be hereinafter referred to as wafers) in a batch type furnace to oxidize a silicon film on each of the wafers to form a silicon oxide film ($SiO_2$ film), there are known a dry oxidation method using oxygen ($O_2$) gas and hydrogen chloride (HCl) gas, and a wet oxidation method for feeding water vapor and oxygen gas into a reaction tube. The type of the oxidation method is selected in accordance with the quality of an intended film.

In the dry oxidation method, a silicon film is oxidized with oxygen gas, and impurities on the surface are removed by the gettering effect of chlorine. Specifically, for example, after a large number of wafers are held on the shelves of a boat to be carried in a vertical heat treatment furnace to form a treatment atmosphere of a predetermined temperature, oxygen gas and chlorine gas are supplied into a reaction tube from the ceiling portion of the heat treatment furnace at ordinary temperatures, and exhausted from the bottom side. In the wet oxidation method, an external combustion system must be provided outside of a heat treatment furnace. In the external combustion system, part of oxygen gas, and hydrogen ($H_2O$) gas are burned to produce water vapor, and the rest of oxygen gas and water vapor are supplied to a reaction tube. In the above described heat treatment furnace, dinitrogen oxide gas ($N_2O$ gas) is fed into a reaction vessel at ordinary temperatures to be allowed to react with a silicon layer on the wafer to produce a nitrogen containing silicon oxide film.

By the way, a defect called slip is more easily caused in the wafer as a process temperature rises. Therefore, in order to avoid the influence of heat on films stacked on an underlayer and in order to save energy, it has been studied to lower the process temperature. However, if the process temperature is lowered, the uniformity of the thickness on the surface of the wafer deteriorates combined with the increase of the diameter of the wafer, and the variation in thickness between wafers (between planes) increases.

After the relationship between the thickness of a silicon oxide film obtained by the dry oxidation method and the position of a wafer on the boat was examined, it was found that the uniformity of the thickness of the film tended to deteriorate as the wafer was positioned on the upper stage side of the boat. The inventor guesses that the reason for this is as follows. FIGS. 6(a), 6(b) and 6(c) schematically show the flow of gases over a wafer W and the temperature and thickness of the wafer W. Oxygen gas and chlorine gas flow from the peripheral edge of the wafer W to the center thereof, and silicon on the wafer is oxidized with oxygen gas. Since heat of the wafer W is radiated from the peripheral edge of the wafer W, the temperature of the wafer W is higher at the center. Thus, the oxidation reaction is accelerated at the center, so that the thickness of the film at the center tends to be originally larger than that at the peripheral edge even if the uniformity of the thickness is high.

On the other hand, hydrogen produced by the decomposition of hydrogen chloride reacts with oxygen to produce a very small amount of water vapor. Since the gases are not sufficiently warmed on the upper stage side of the boat, the amount of produced water vapor increases as the gases are heated from the peripheral edge of the wafer W toward the center thereof. This water vapor serves to increase the thickness of the oxide film, so that the difference in amount of produced water vapor has a great influence on the thickness of the film. As a result, the distribution in thickness is a so-called crest distribution wherein the thickness of the film at the center of the wafer W is large, so that the uniformity of the thickness deteriorates. Then, since the gases are warmed as the gases travel toward the bottom of the reaction tube, the water vapor producing reaction is substantially in an equilibrium state on the lower stage side of the boat, so that water vapor is completely produced before the gases flow along the wafer W. Therefore, when the process gases flow from the peripheral edge of the wafer W toward the center thereof, the amount of water vapor hardly varies regardless of the position of the wafer W, so that the uniformity of the thickness of the film is enhanced. It is thus considered that the uniformity of the thickness of the film is low on the upper stage side of the boat so as to increase the difference in thickness of the film between wafers on the upper and lower stage sides.

Also in the process for producing a nitrogen containing silicon oxide film using dinitrogen oxide gas, the same tendency appears if the process temperature is lowered. That is, dinitrogen oxide gas is decomposed to allow oxygen to react with silicon to produce the nitrogen containing silicon oxide film, and the active species of nitrogen produced by the decomposition of the dinitrogen oxide gas enters the silicon oxide film to grow the nitrogen containing silicon oxide film. The temperature of the wafer W is higher at the center of the wafer W, and the dinitrogen oxide gas is not sufficiently decomposed on the upper stage side of the boat if the process temperature is low. Therefore, as the dinitrogen oxide gas flows toward the center of the wafer W, the decomposition reaction is further accelerated at the center of the wafer w than the peripheral edge thereof, so that the thickness of the film at the center of the wafer W tends to be larger than that at the peripheral edge thereof. Since the dinitrogen oxide gas is warmed as it travels toward the bottom of the reaction tube, the decomposition thereof sufficiently proceeds on the lower stage side of the boat, or the decomposition thereof further proceeds on the lower stage side of the boat than the upper stage side thereof even if it is not sufficient. Thus, the difference in degree of decomposition between the center and peripheral edge of the wafer is small. As a result, the inplane uniformity of the thickness of the film is higher than that on the upper stage side.

Thus, in the present circumstances, the inplane uniformity of the thickness of the film on the wafer is low on the upper stage side, and the uniformity between wafers is low, so that it is difficult to lower the process temperature.

The first invention provided by the present application has been made in such circumstances, and it is an object of the first invention to provide a technique capable of obtaining the high uniformity of the thickness of an oxide film, and contributing to the lowering of a process temperature, when an oxidation process is carried out with respect to an object to be treated.

The art related to a second invention provided by the present application will be described below.

There is a process called the CVD (Chemical Vapor Deposition) as one of deposition processes which are processes for fabricating semiconductor devices. This technique is designed to feed a process gas into a reaction tube to deposit a thin film on the surface of a semiconductor wafer (which will be hereinafter referred to as a wafer) by a chemical gas phase reaction. As one of systems for carrying out such a deposition process in a batch, there is a vertical heat treatment system. As shown in, e.g., FIG. 11, this system comprises a vertical reaction tube 112 provided on a cylindrical manifold 111, a heater 113 provided so as to surround the reaction tube 112, a gas feed pipe 114 extending into the manifold 111, and an exhaust pipe 115 connected to the manifold.

In such a system, a large number of wafers W are held on the shelves of a holder 116 called a wafer boat to be carried in the reaction tube 112 from an opening which is formed in the bottom end of the manifold 111, and a process gas is fed into the reaction tube 112 from a gas supply source 117 via the gas feed pipe 114 to deposit a thin film. At this time, the process gas is heated by the heater 113 in the reaction tube 112 to be decomposed, and further heated to a reaction temperature or higher to carry out a predetermined reaction. The reactant is deposited on the wafer W to form a predetermined film thereon.

By the way, if the film is deposited on the wafer W by means of the above described system, the thickness of the film in the central portion of the wafer tends to be larger than that in the peripheral edge portion thereof as shown in FIG. 12. It is considered that the reason for this is as follows. That is, in the above described vertical heat treatment system called a so-called batch type furnace, a process gas is fed into the reaction tube 112 from the gas feed pipe 114 to be supplied from the peripheral edge portion of the wafer W to the wafer W, which is held on the wafer boat 116, to flow along the wafer from the peripheral portion of the wafer to the central portion thereof, so that the concentration of the process gas in the central portion of the wafer is higher than that in the peripheral portion thereof.

In a process for raising the temperature of the wafer to a process temperature, the heat radiation amount in the peripheral edge portion of the wafer W is greater than that in the central portion thereof, so that the temperature of the central portion of the wafer is higher than that of the peripheral portion thereof. Thus, it is guessed that the deposition reaction is further accelerated in the central portion of the wafer W, in which the temperature and concentration of the process gas are higher, than the peripheral portion thereof due to the differences in temperature and concentration of the process gas between the peripheral and central portions of the wafer W, so that the thickness of the film on the central portion of the wafer W is larger than that on the peripheral portion thereof.

On the other hand, in a semiconductor fabricating process, in order to prevent a bad influence on a film produced at the last step and in order to save energy, a low temperature process is desired. However, the above described phenomenon that the thickness of the film increases in the central portion of the wafer tends to be conspicuous as the process temperature is lowered, so that it is difficult to realize a low temperature process in the existing system.

Therefore, the inventor has studied a technique for lowering a process temperature in the reaction tube 112 by preheating a process gas to a predetermined temperature by means of a heater (not shown), which is provided outside of the reaction tube 112, before feeding the process gas into the reaction tube 112, and feeding the activated and sufficiently heated process gas into the reaction tube 112. For example, the heater comprises a heating chamber for heating a fed process gas, and a heater, provided outside of the heating chamber, for heating the heating chamber. In this technique, since the process gas is preheated by the heater to a temperature approximating to, e.g., a decomposition temperature, the sufficiently activated process gas is fed into a deposition region, and a reaction sufficiently occurs when the process gas reaches the peripheral edge portion of the wafer. Thus, the reaction state in the central portion of the wafer is the same as the reaction state in the peripheral edge portion thereof, so that it is possible to provide the high uniformity of the thickness of the film even if the process temperature in the reaction tube 112 is low.

However, in a low pressure CVD process for reducing the pressure in the reaction tube 112 to carry out a process, the pressure in the heater is also reduced. If the pressure in the heater is reduced to, e.g., about 200 Torr, convection is difficult to occur. In addition, if the pressure in the heater is low, the partial pressure of the process gas decreases, so that heat conduction due to the convection of the process gas in the heater is difficult to occur. Thus, heat is not transferred into the interior of the heater, and the efficiency of heat transfer to the process gas is bad, so that it is difficult to heat the process gas to a temperature at which the process gas is sufficiently activated.

The second invention provided by the present application has been made in such circumstances, and it is an object of the second invention to provide a heat treatment system and method capable of obtaining the high uniformity of the thickness of a formed film and contributing to the lowering of a process temperature by supplying a process gas preheated by a heating part to a reaction vessel, for example, when a thin film is deposited on an object to be treated.

SUMMARY OF THE INVENTION

According to one aspect of the present invention, there is provided a heat treatment system comprising a reaction vessel, in which an object to be treated is carried and in which a heat treatment atmosphere at a predetermined temperature is formed, and a combustion system which is provided outside of the reaction vessel, wherein the combustion system allows hydrogen gas and oxygen gas, which pass through a first gas passage and a second gas passage, respectively, to be heated by heating means and to be fed into a combustion chamber to be burned therein to produce water vapor, and wherein gas is fed from the combustion chamber into the reaction vessel to carry out an oxidation process with respect to a silicon layer of the object to form an oxide film thereon, the heat treatment comprising: means for supplying one or more kinds of process gases, which are used for carrying out a process other than the oxidation process using water vapor, to one of the first and second gas passages; and a ventilation resistance material, provided in a region heated by the heating means in one of the gas passages through which the one or more kinds of gases pass, for enhancing the heating efficiency of the gases, wherein the heating means is utilized for heating the process gases to a temperature, at which the process gases are allowed to react or activated, when the process other than the oxidation process using water vapor is carried out with respect to the object by the process gases.

This heat treatment system may further comprise a control part for controlling a heating temperature of the heating means in accordance with a heat treatment which is carried out in the reaction vessel. For example, the reaction vessel corresponds to a reaction tube of a vertical heat treatment furnace. As an example of the process other than the oxidation process using water vapor, there is a process for passing a process gas containing a gas of a compound including hydrogen and chlorine, e.g., hydrogen chloride gas or dichloroethylene gas, and oxygen gas through the second gas passage to heat the process gas by the heating means to produce a very small amount of water vapor to supply the process gas containing the very small amount of water vapor into a heat treatment furnace to carry out an oxidation process with respect to the object. In this case, a temperature to which the process gas containing the gas of the compound including hydrogen and chlorine and oxygen gas is heated by the heating means is preferably higher than a temperature at which the process gas is used for processing the object in the reaction vessel. In this case, since the very small amount of water vapor has been produced when the process gas enters the reaction vessel, the amounts of water vapor on the center and periphery of the object are not so different. Therefore, the difference in degree of the thickness increasing effect due to water vapor decreases, so that the inplane uniformity is enhanced. In addition, the combustion system is utilized for heating the process gas, and this is advantageous to costs and space efficiency.

As another example of the process other than the oxidation process using water vapor, there is a process for passing dinitrogen oxide gas through the first or second gas passage to heat and activate dinitrogen oxide gas by the heating means to supply the activated dinitrogen oxide gas into the reaction vessel to form a nitrogen containing silicon oxide film on the object. In this case, a temperature to which dinitrogen oxide gas is heated by the heating means is preferably higher than a temperature at which dinitrogen oxide gas is used in a heat treatment furnace for processing the object. In this case, since dinitrogen oxide gas has been previously activated, there is no or a little difference in degree of activation due to the difference in place when the gas flows along the surface of the object, so that the inplane uniformity of the thickness is enhanced.

According to another aspect of the present invention, there is provided a heat treatment system wherein an object to be treated is carried in a reaction vessel, which has been pressure-reduced to a predetermined degree of vacuum by evacuating means and the interior of which is heated to a predetermined process temperature, and a process gas is supplied into the reaction vessel via a gas feed passage to process the object, the heat treatment system comprising: a heating part, provided in the gas feed passage, for heating the process gas to a predetermined temperature before the process gas is supplied to the reaction vessel; and an orifice formed in the gas feed passage between the heating part and the reaction vessel, wherein while the pressure in the heating part is higher than the pressure in the reaction vessel due to pressure loss at the orifice, the process gas is supplied into the heating part via the gas feed passage to preheat the process gas to a predetermined temperature to supply the preheated process gas to the reaction vessel. The heating part may comprise a heating chamber for heating the process gas, and a heater part, provided so as to surround the heating chamber, for heating the heating chamber.

In such a heat treatment system, there is carried out a heat treatment method comprising the steps of: supplying the process gas to a heating part, which is provided outside of the reaction vessel, to preheat the process gas; and feeding the preheated process gas into the reaction vessel, wherein the step of preheating the process gas is carried out while the pressure in the heating part is higher than the pressure in the reaction vessel due to pressure loss at an orifice which is formed in a gas feed passage provided between the heating part and the reaction vessel and which has a smaller inner diameter than that of the gas feed passage.

Thus, even if a low pressure process is carried out in the reaction vessel, the degree of reduced pressure in the heating part is smaller than that in the reaction vessel due to pressure loss at the orifice. Thus, convection sufficiently occurs in the heating part, and the partial pressure of the process gas increases, so that the heating part is sufficiently heated to the inside thereof to improve the heating efficiency of the process gas. Thus, since the process gas can be preheated in the heating part to a predetermined temperature, e.g., a temperature at which the process gas is activated to an extent that the process gas is decomposed, the process temperature can be lowered in the reaction vessel, and the high uniformity of the thickness of a deposited film can be ensured even in such a low temperature process.

According to a further aspect of the present invention, there is provided a heat treatment system wherein an object to be treated is carried in a reaction vessel, the interior of which is heated to a predetermined process temperature, and a process gas is supplied into the reaction vessel via a gas feed passage to process the object, the heat treatment system comprising: a heating part, provided in the gas feed passage, for heating the process gas to a predetermined temperature before the process gas is supplied to the reaction vessel, wherein the gas feed passage arranged between the heating part and the reaction vessel comprise a double pipe comprising an inner pipe and an outer pipe which is provided outside of the inner pipe so as to be spaced from the inner pipe, and wherein the process gas is supplied into the heating pipe via the gas feed passage to be preheated to a predetermined temperature to be supplied to the reaction vessel via the gas feed passage.

In such a heat treatment system, the gas feed pipe arranged between the heating part and the reaction vessel comprises a double pipe, and the preheated process gas is supplied to the reaction vessel via the inner pipe of the double pipe. Therefore, it is possible to suppress the radiation of the process gas passing through the double pipe, and it is possible to feed the process gas into the reaction vessel while a high temperature is maintained.

The outer pipe of the double pipe of the gas feed passage may be bent to form a flange which is connected to the reaction vessel via a sealing member. In this case, since the temperature in the outer pipe is lower than that in the inner pipe, the gas feed passage can be connected to the reaction vessel without deteriorating the sealing member of, e.g., a resin, due to heat.

According a still further aspect of the present invention, there is provided a heat treatment system wherein an object to be treated is carried in a reaction vessel, which has been pressure-reduced to a predetermined degree of vacuum by evacuating means and the interior of which is heated to a predetermined process temperature, and a process gas is supplied into the reaction vessel via a gas feed passage to process the object, the heat treatment system comprising: a gas chamber which is provided in the gas feed passage and through which the process gas passes; a partition wall for dividing the gas chamber into a plurality of compartments in ventilation directions of the process gases; a vent hole which is formed in the partition wall and which has a smaller inner diameter than that of the gas feed passage; and a heater part, provided so as to a heating chamber, for heating the heating chamber which is an upstream compartment of the plurality of compartments, wherein while the pressure in the heating chamber is higher than the pressure in the reaction vessel due to pressure loss at the vent hole formed in the partition wall, the process gas is supplied into the heating chamber via the gas feed passage to preheat the process gas to a predetermined temperature to supply the preheated process gas to the reaction vessel.

Also in such a construction, the degree of reduced pressure in the heating chamber is smaller than that in the reaction vessel due to pressure loss at the vent hole, so that the heating efficiency of the process gas in the heating chamber is improved.

Preferably, a ventilation resistance material is provided in the heating chamber, the ventilation resistance material contacting the process gas to preheat the process gas to a predetermined temperature. In this case, the heating efficiency of the process gas is further improved.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 4(a) through 4(c) are illustrations showing a gas supply state in a combustion system every process;

DESCRIPTION OF THE PREFERRED EMBODIMENTS

Referring now to the accompanying drawings, particularly to FIGS. 1 through 5, a preferred embodiment of a first invention provided by the present application will be described below.

Figure 1:
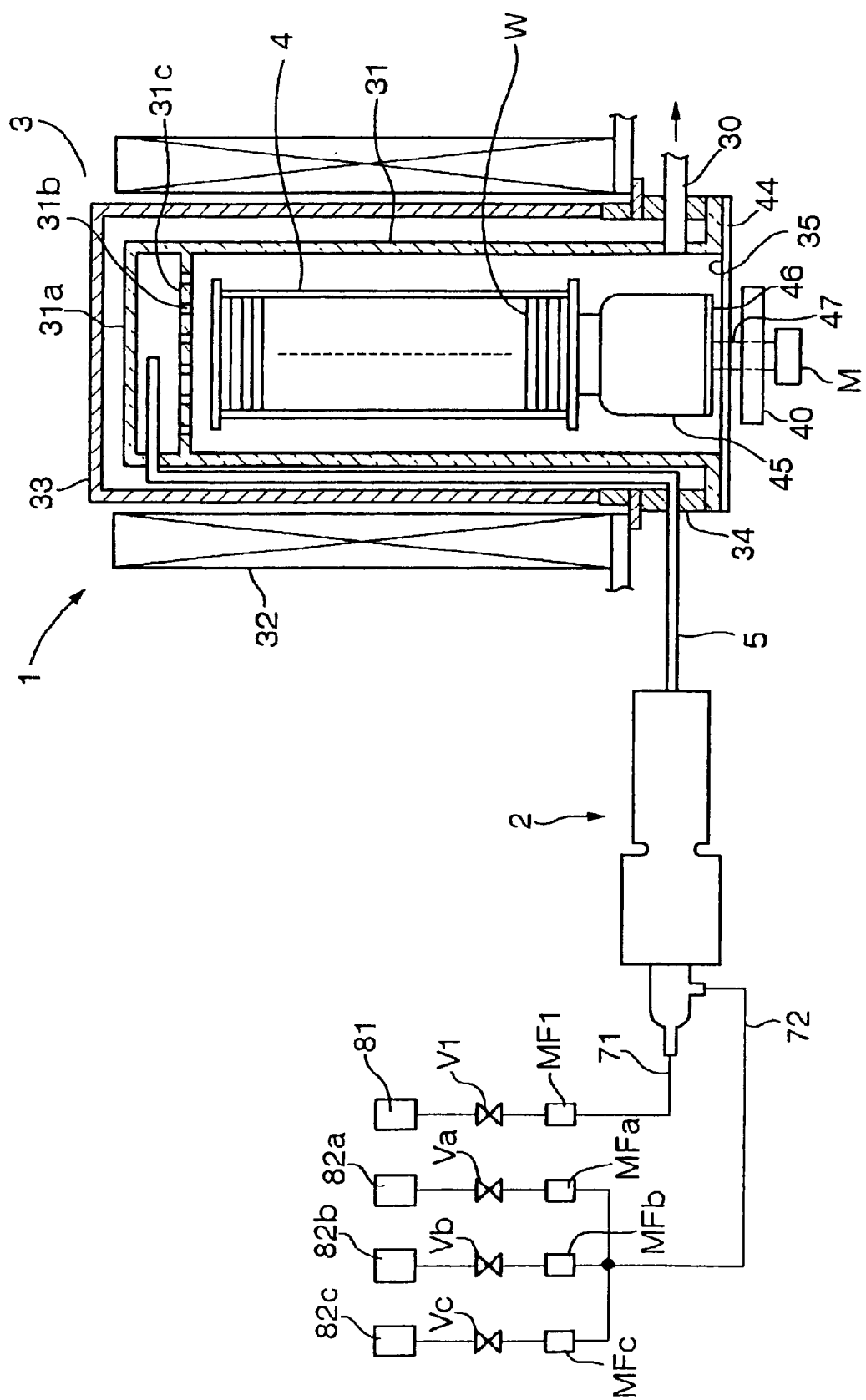
FIG. 1 is a longitudinal sectional view showing a preferred embodiment of a heat treatment system according to the present invention.

FIG. 1 shows a preferred embodiment of a heat treatment system according to the present invention. This heat treatment system serves as a system for carrying out a so-called wet oxidation process for burning hydrogen gas and oxygen gas to produce water vapor to carry out an oxidation process on a wafer using the produced water vapor, as a system for carrying out a so-called dry oxidation process using oxygen gas and hydrogen chloride gas, and as a system for carrying out a process using dinitrogen oxide gas. The heat treatment system comprises a vertical heat treatment unit 1 and a combustion system 2.

Figure 2:
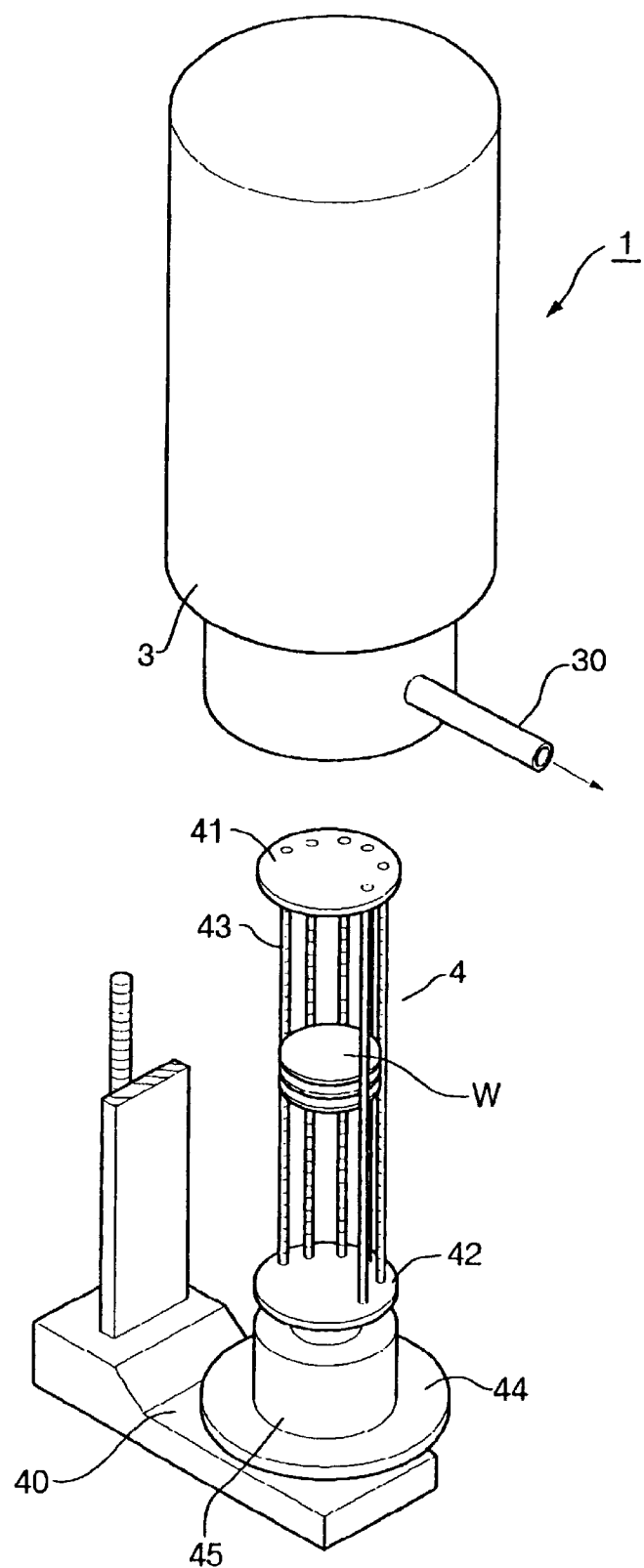
FIG. 2 is a perspective view showing a vertical heat treatment unit for use in the heat treatment system of FIG. 1.

The structure of the vertical heat treatment unit 1 will be described. As shown in FIGS. 1 and 2, this unit 1 comprises a vertical heat treatment furnace 3, a wafer boat 4 serving as a holder, an boat elevator 40 for vertically moving the wafer boat 4, and a gas supply pipe 5 and exhaust pipe 30 which are connected to the heat treatment furnace 3.

The vertical heat treatment furnace 3 comprises a vertical reaction tube 31 which is a reaction vessel of, e.g., quartz, a heater 32 which is a heating means of a resistance heating element or the like provided so as to surround the reaction tube 31, and a soaking vessel 33 which is supported on a heat insulating member 34 between the reaction tube 31 and the heater 32. The bottom end of the reaction tube 31 is open, and the reaction tube 31 is provided with a gas diffusion plate 31c having a large number of gas holes 31b slightly below the top face 31a thereof. The gas supply pipe 5 passes through the heat insulating member 34 from the outside to be bent in an L shape inside of the heat insulating member 34 to vertically extend between the reaction tube 31 and the soaking vessel 33 to extend into a space between the top face 31a of the reaction tube 31 and the gas diffusion plate 31c.

For example, as shown in FIG. 2, the wafer boat 4 is provided with a plurality of struts 43 between a top board 41 and a base plate 42, and the struts 43 are formed with grooves at regular intervals in vertical directions for engaging and holding the periphery of each of wafers W. The wafer boat 4 is mounted on a lid 44, which opens and closes an opening 35 formed in the bottom end of the reaction tube 31, via a heat reserving part, e.g., a heat reserving cover 45. The heat reserving cover 45 is mounted on a turn table 46 so as to be rotatable by means of a driving part M, which is provided on the boat elevator 40, via a rotating shaft 47. The lid 44 is provided on the boat elevator 40, so that the wafer boat 4 is carried in and out of the heat treatment furnace 3 by the vertical movement of the boat elevator 40.

Figure 3:
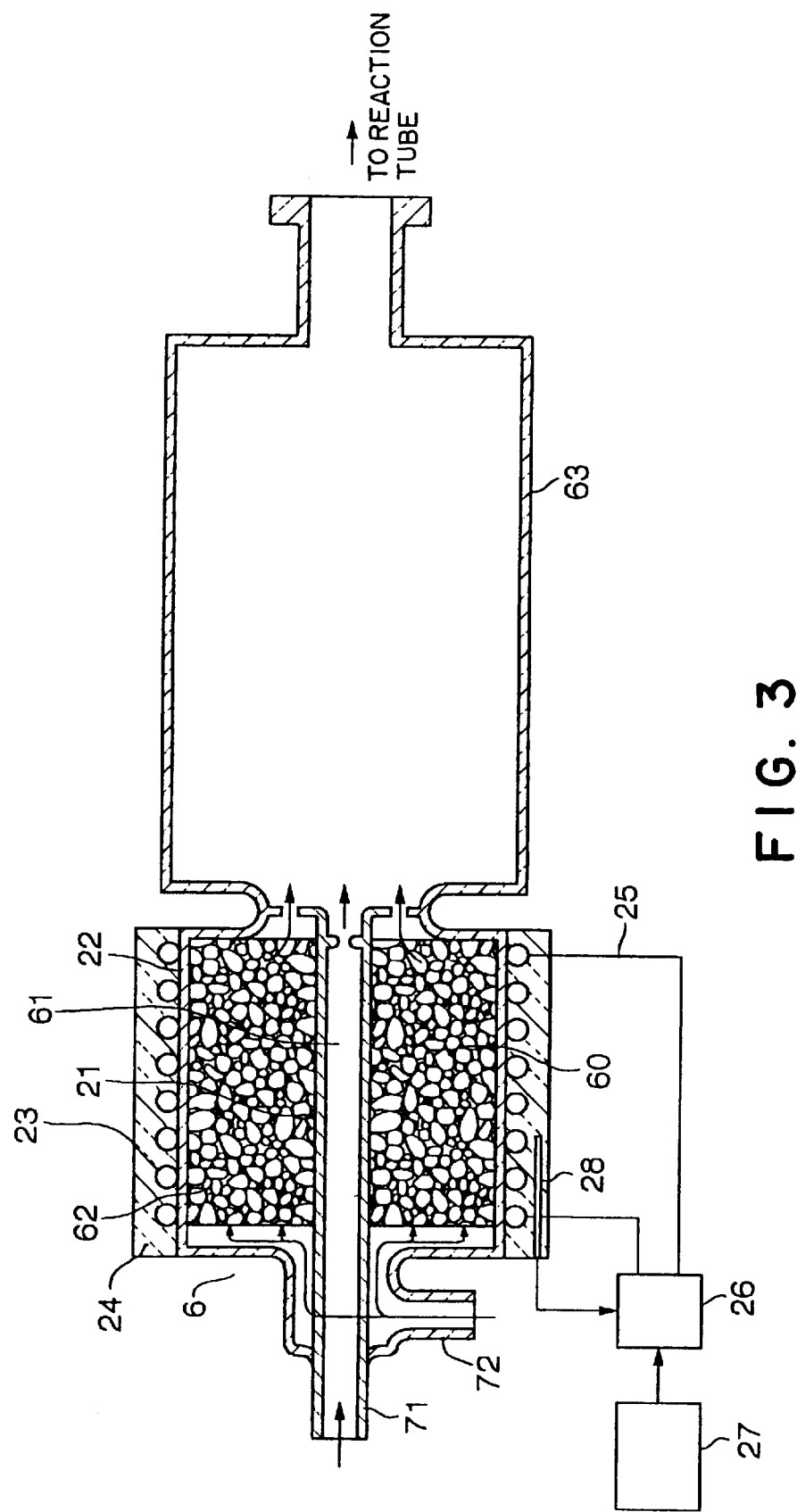
FIG. 3 is a sectional view showing a combustion system for use in the heat treatment system of FIG. 1.

As shown in FIG. 1, the combustion system 2 is provided on the way of the gas supply pipe 5 outside of the vertical heat treatment unit 1. As shown in FIG. 3, the combustion system 2 has a concentric double structure part 6 comprising an inner tube 21 and outer tube 22 of, e.g., transparent quartz. A heating chamber formed by an inside region of the inner tube 21 will be hereinafter referred to as an inside heating chamber 61, and a heating chamber formed by an inside region of the outer tube 22 will be hereinafter referred to as an outside heating chamber 62. The inside heating chamber 61 is communicated with a first gas supply pipe 71 while extending as it is. The outside heating chamber 62 is communicated with a second gas supply pipe 72, the upstream side of which is narrowed and which extends from the narrowed portion in a direction perpendicular thereto. Furthermore, a gas supply passage extending from the first gas supply pipe 71 to the inside heating chamber 61, and a gas supply passage extending from the second gas supply pipe 72 to the outside heating chamber 62 correspond to first and second gas passages, respectively, as set forth in claims.

On the outer peripheral portion of the outside heating chamber 62, a heating means, e.g., a carbon wire heater 23, is spirally provided. A cylindrical heat insulating member 24 is provided so as to cover the heater 23. For example, the carbon wire heater 23 is formed by spirally filling a string-like member, which is formed by knitting a plurality of bundles of carbon fibers, in a quarts tube. The carbon wire heater 23 generates heat when the carbon wire heater 23 is energized by a power supply line 25. The power supply line 25 is connected to a power control part 26. For example, the power control part 26 controls the current carrying quantity to the carbon wire heater 23 on the basis of a signal, which corresponds to a set heating temperature assigned by a main control part 27 for controlling the heat treatment system, and a temperature detection signal from a temperature sensor 28 which is provided in the vicinity of the heater 23 and which comprises, e.g., a thermocouple.

The outside heating chamber 62 is filled with a ventilation resistance material 60 of, e.g., a large number of transparent quarts glass beads. By providing the ventilation resistance material 60, the gas residence time increases, and the ventilation resistance material 60 is heated, so that the gas is efficiently heated while contacting the heated ventilation resistance material 60. Furthermore, the ventilation resistance material 60 should not be limited thereto, but a plurality of ventilation plates having a large number of vent holes may be arranged at intervals in passage directions so as to block the passage.

The inside heating chamber 61 and the outside heating chamber 62 are communicated with a downstream combustion chamber 63. When wet oxidation is carried out using hydrogen gas and oxygen gas as process gases, hydrogen gas and oxygen gas cause a combustion reaction in the combustion chamber 63 to produce water vapor.

The downstream side of the combustion system 2 will be described. As shown in FIG. 1, the first gas supply pipe 71 is connected to a hydrogen gas source 81, and a valve V1 and a mass flow controller MF1 serving as a flow regulating part are provided therebetween. The second gas supply pipe 72 branches off in, e.g., three directions, to be connected to an oxygen gas source 82a, a dinitrogen oxide gas source 82b and a hydrogen chloride gas source 82c, and valves Va, Vb and Vc and mass flow controllers MFa, MFb and MFc are provided therebetween, respectively.

The operation of the above described preferred embodiment will be described below. In this preferred embodiment, three processes including a wet oxidation process, a dry oxidation process and a process using dinitrogen oxide gas can be carried out with respect to a wafer which is an object to be treated and on the surface portion of which a silicon layer has been formed. The dry oxidation process aiming to improve the uniformity of the thickness and the process using dinitrogen oxide gas will be previously described.

(Dry Oxidation Process)

A large number of, e.g., 60, wafers W serving as objects to be treated are held on the shelves of the wafer boat 4 to be carried in the reaction tube 31 which has been preheated to a predetermined temperature by means of the heater 32, and the opening 35 serving as a furnace opening is airtightly closed by the lid 44 (state shown in FIG. 1). Subsequently, the temperature in the reaction tube 31 is raised to a predetermined process temperature, e.g., 900° C. At the step of carrying the wafer W in the reaction tube 31 and at the step of raising the temperature in the reaction tube 31, nitrogen gas containing, e.g., a very small amount of oxygen gas, is supplied to the reaction tube 31 from a gas supply pipe (not shown), and the supply of the gas is stopped when the temperature in the reaction tube 31 reaches a process temperature. Then, the gas in the reaction tube 31 is exhausted from the exhaust pipe 30 by an exhaust means (not shown) so that the state in the reaction tube 31 is a slightly reduced pressure state. In this state, the temperature of the wafers W is stabilized, and then, an oxidation process is carried out.

On the other hand, in the combustion system 2, in accordance with the selection of a dry oxidation process which has been selected by the main control part 27, a corresponding temperature set signal is fed to the power control part 26, and the carbon wire heater 23 is controlled so that the temperature in the heating chambers 61 and 62 is a set temperature of, e.g., 1000° C. Then, the valves Va and Vb are open to allow oxygen gas and hydrogen chloride gas to flow into the combustion system 2 while the mass flow controllers MFa and MFb control the flow rates of oxygen gas and hydrogen chloride gas to be predetermined flow rates, e.g., 10 slm and 0.3 slm, respectively. These gases pass through the ventilation resistance material 60 to flow into the combustion system 2 while contacting the ventilation resistance material 60 in the outside heating chamber 62, so that the gases are heated to about 1000° C. while passing therethrough. Thus, as shown in FIG. 4(a), it is considered that oxygen gas and hydrogen chloride gas react as shown by the following formulae to produce a very small amount, e.g., hundreds ppm, of water vapor. In this process, the inside heating chamber 61 is not used.

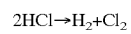

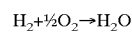

The process gas thus heated enters the heat treatment furnace 3 via the gas supply pipe 5, and rises to flow into the upper portion of the reaction tube 31 while passing through the soaking pipe 33 to be heated. This process gas is further supplied from the gas holes 31b to a process region in the reaction tube 31 to be exhausted from the bottom exhaust pipe 30. At this time, the process gas enters spaces between the wafers W stacked in the form of shelves, and the silicon layer on the surface portion of each of the wafers W is oxidized while the gettering of the surface of each of the wafers is carried out with chlorine gas, so that a silicon oxide film is produced thereon. As described above, the process gas contains a very small amount of water vapor which increases the thickness of the oxide film.

(Process Using Dinitrogen Oxide Gas)

A large number of wafers W are carried in the reaction tube 31 by means of the wafer boat 4, and the temperature in the reaction tube 31 is raised to a predetermined process temperature, e.g., 900° C., to be stabilized in the same manner as that described above. On the other hand, in the combustion system 2, in accordance with the selection of the process using dinitrogen oxide gas which has been selected by the main control part 27, a corresponding temperature set signal is fed to the power control part 26, and the carbon wire heater 23 is controlled so that the temperature in the heating chambers 61 and 62 is a set temperature of, e.g., 900 to 1000° C. Then, the valve Vc is open to allow dinitrogen oxide gas to flow into the combustion system 2 while the mass flow controller MFc controls the flow rate of dinitrogen oxide gas to be a predetermined flow rate of, e.g., 1 to 10 slm. Thus, dinitrogen oxide gas passes through the ventilation resistance material 60 to flow into the combustion system 2 while contacting the ventilation resistance material 60 in the outside heating chamber 62, so that the gas is heated to about the set temperature while passing therethrough. Thus, although dinitrogen oxide gas is not decomposed, the gas is activated to an extent that it is decomposed immediately after it flows into the reaction tube 31. This state is shown in FIG. 4(b) wherein $N_2O^*$ shows the activated state of $N_2O$. Also in this process, the inside heating chamber 61 is not used.

Dinitrogen oxide thus activated enters the reaction tube 31 to oxidize and nitride the silicon layer of the wafer W to produce a nitrogen containing silicon oxide film.

(Wet Oxidation Process)

A large number of wafers W are carried in the reaction tube 31 by means of the wafer boat 4, and the temperature in the reaction tube 31 is raised to a predetermined process temperature, e.g., 900° C., to be stabilized in the same manner as that described above. On the other hand, in the combustion system 2, in accordance with the selection of the wet oxidation process which has been selected by the main control part 27, a corresponding temperature set signal is fed to the power control part 26, and the carbon wire heater 23 is controlled so that the temperature in the heating chambers 61 and 62 is a set temperature of, e.g., 900 to 950° C. Then, the valves V1 and Va are open to allow hydrogen gas and oxygen gas to flow into the combustion system 2 while the mass flow controllers MF1 and MFa control the flow rates of hydrogen gas and oxygen gas to be predetermined flow rates of, e.g., 3 to 10 slm and 3 to 10 slm, respectively. As a result, hydrogen gas and oxygen gas are heated in the inside heating chamber 61 and the outside heating chamber 62, respectively, and a combustion reaction between part of oxygen gas and hydrogen gas occurs in the combustion chamber 63 to produce water vapor. FIG. 4(c) is an illustration showing this state. Thus, the process gas containing oxygen gas and water vapor flows into the heat treatment furnace 3 to enter spaces between the wafers W stacked in the form of shelves, so that the silicon layer on the surface portion of each of the wafers W is oxidized with oxygen gas and wafer vapor to produce a silicon oxide film.

According to such a preferred embodiment, the uniformity of the silicon oxide film produced by the dry oxidation process and the uniformity of the nitrogen containing silicon oxide film produced by dinitrogen oxide film are high on the surface of the wafer W, and the uniformity of the thickness of the films between the wafers W is also high. It is considered that the reason for this is as follows.

First, in the case of the dry oxidation process, the process gas (a mixed gas of oxygen gas and hydrogen chloride gas) is heated to, e.g., about 1000° C., in the combustion system 2 to produce a very small amount of water vapor. Since the amount of water vapor produced once does not decrease even if the temperature decreases, even if water vapor is slightly cooled while passing through the gas supply pipe 5 on the secondary side, if water vapor has been produced at a higher temperature than the process temperature in the reaction tube 31, the process gas does not produce additional water vapor in the reaction tube 31.

Figure 5:
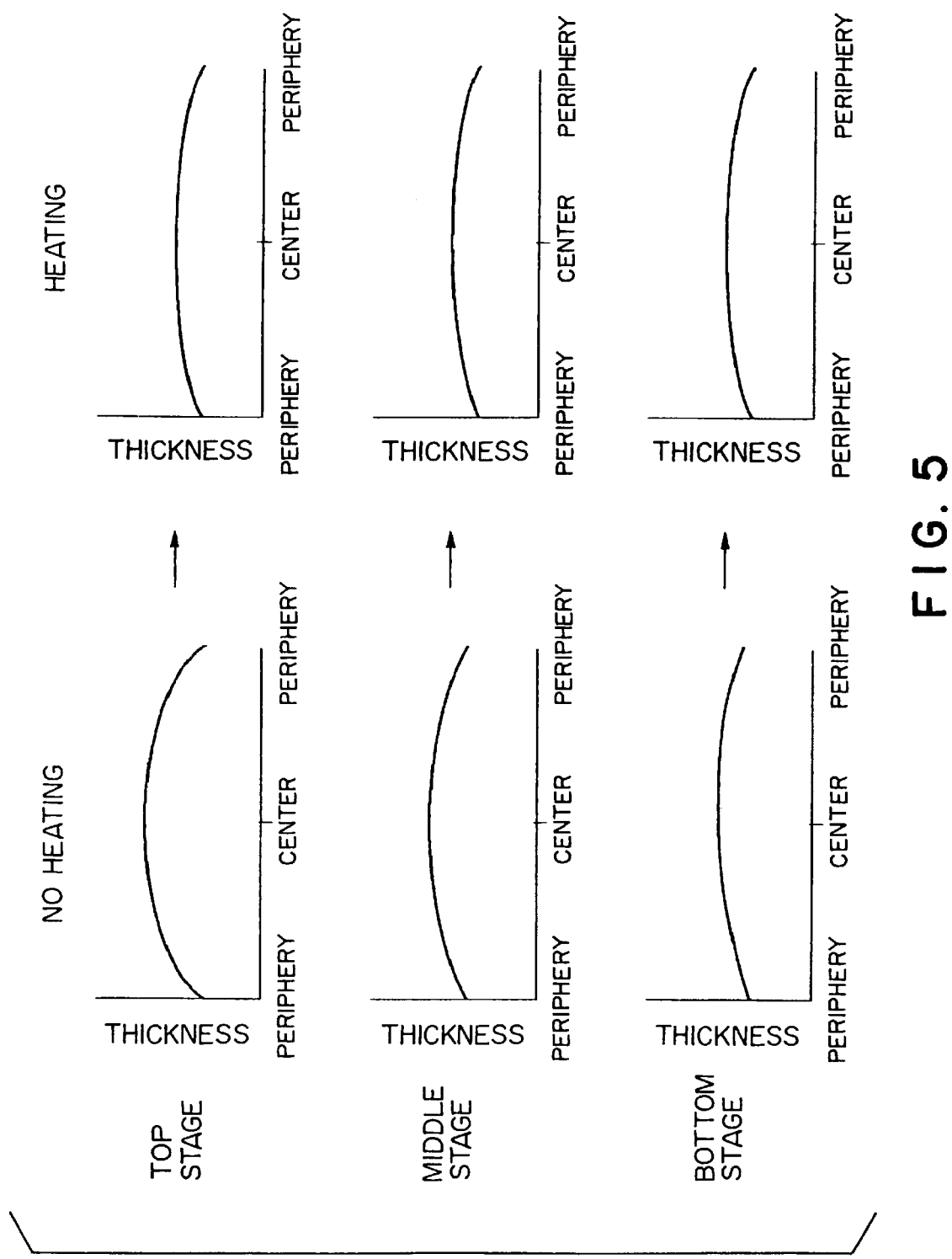
FIG. 5 is an illustration showing a thickness distribution at positions in a wafer boat.
Figure 6:
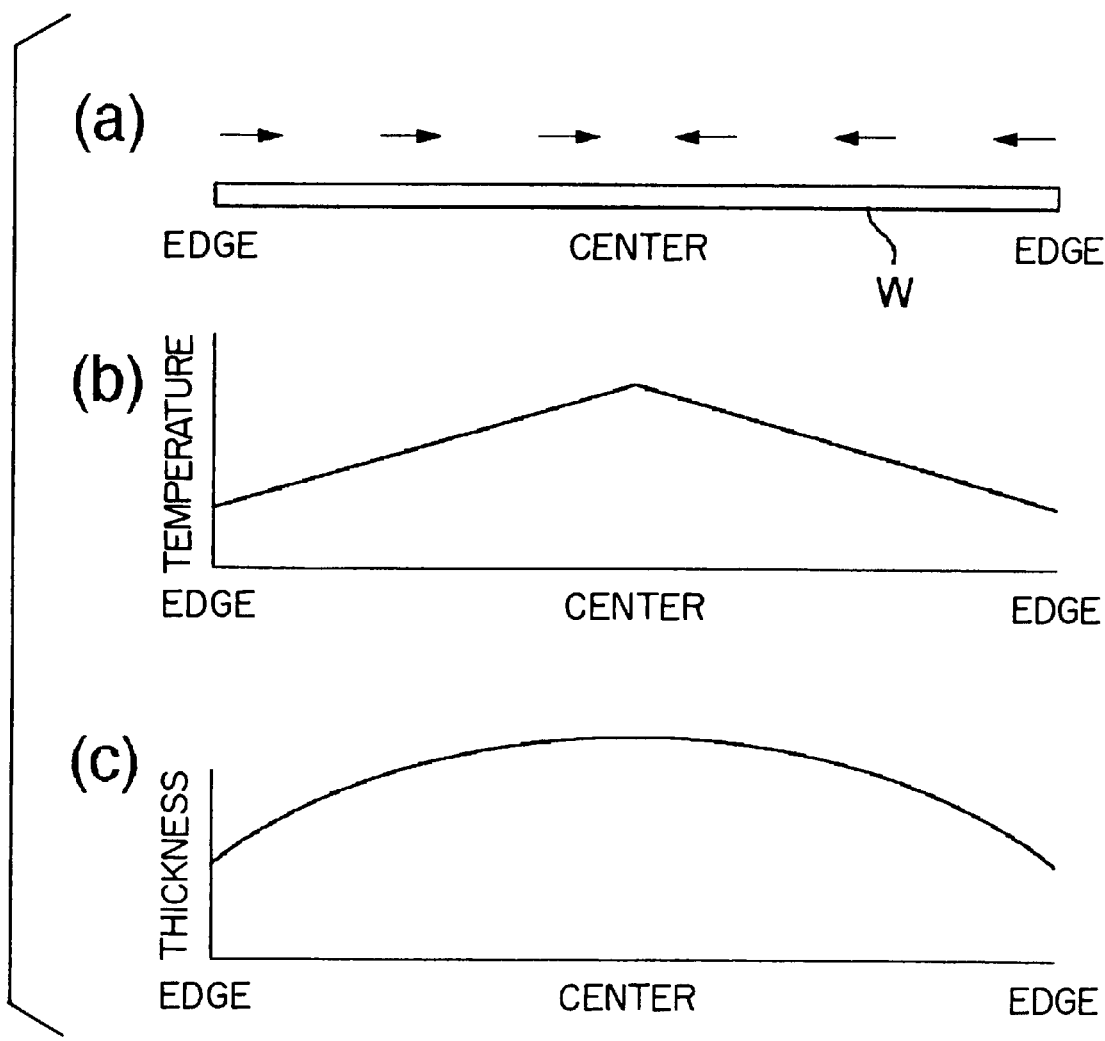
FIGS. 6(a) through 6(c) are illustration for explaining problems in a conventional oxidation method.

Therefore, when the process gas enters spaces between the wafers W stacked on the wafer boat 4, water vapor has been completely produced, so that the amount of water vapor contained in the process gas flowing from the peripheral edge of the wafer W toward the center thereof is substantially the same at any positions. As a result, the degree of the thickness increasing effect due to water vapor in the plane is also substantially on the wafer W arranged in the upper stage of the wafer boat 4, so that the inplane uniformity of the thickness increases. Conventionally, since the production of water vapor proceeds toward the lower stage of the wafer boat 4, the uniformity of the thickness is bad on the upper stage side, and the uniformity of the thickness is higher on the lower stage side. In this preferred embodiment, the gas atmosphere on the lower stage side can be produced on the upper stage side, so that the variation in thickness distribution between the wafers W decreases, i.e., the uniformity of the thickness between planes increases. FIG. 5 schematically shows the thickness distributions on the top, middle and bottom stages when the process gas is not heated and when the process gas is heated. For example, experiments were carried out on process conditions described in the above described preferred embodiment. Conventionally (when the heater 23 of the combustion system 2 was turned off), the inplane uniformity of the thickness on the wafer on the upper stage side was about ±3%. However, when the heater 23 of the combustion system 2 was turned on, the inplane uniformity was about ±1%.

Furthermore, strictly speaking, water vapor contributes to the increase of the thickness, so that it is considered that it slightly decreases toward the center of the wafer W. However, as described in "Description of Related Art", the temperature of the center of the wafer W is higher than that of the peripheral edge portion thereof, so that the thickness at the center originally tends to be larger. Therefore, it can be said that the large degree of the increase of the thickness of the film in the peripheral portion causes the function of increasing the thickness in the peripheral portion to enhance the uniformity of the thickness.

When dinitrogen oxide gas is used, the gas is activated to a state immediately before the gas is decomposed in the combustion system 2. Therefore, when the gas enters the reaction tube 31 to reach the upper stage side of the wafer boat 4, decomposition considerably proceeds. Thus, when the gas flows from the periphery of the wafer W toward the center thereof, the degrees of decomposition at the periphery and center of the wafer W are hardly different, so that the amount of active species produced by the composition of dinitrogen oxide is the same or substantially the same at any positions. As a result, the inplane uniformity of the thickness on the wafer W positioned at the top stage of the wafer boat 4 is enhanced. Therefore, the variation in inplane uniformity is small between the wafer W on the upper stage side and the wafer W on the lower stage side, and the uniformity of the thickness between planes is enhanced.

The phenomenon that water vapor is produced in the reaction tube 31 in the dry oxidation process, and the phenomenon that dinitrogen oxide gas is decomposed in the reaction tube 31 in the process using dinitrogen oxide gas, have a greater influence on the inplane uniformity of the thickness and the uniformity of the thickness between planes at lower temperatures. Therefore, according to this preferred embodiment, it is possible to greatly contribute to lower temperature in heat treatment.

Moreover, since the combustion system used for carrying out a wet oxidation process is utilized for heating a process gas in a dry oxidation process and in a process using dinitrogen oxide gas, it is not required to additionally provide a dedicated heater, and this is advantageous to the costs and space efficiency.

The gas for use in the dry oxidation process should not be limited to hydrogen chloride gas, but dichloroethylene ($C_2H_2Cl_2$, trans-1,2-dichloroethylene) may be used, or these gases may be mixed. In the above description, when a process other than a wet oxidation process is carried out, the process gas is heated using the outside heating chamber 62. According to the present invention, the inside heating chamber 61 may be used, and both of the heating chambers 61 and 62 may be used. According to the present invention, a gas passage in addition to the first and second gas passages may be formed outside of a heating chamber, e.g., a heater 23, in addition to the heating chambers 61 and 62 to heat the process gas by the heater 23 while passing the process gas through the gas passage.

As described above, according to the first invention provided by the present application, when an oxidation process is carried out with respect to an object to be treated, it is possible to obtain the high uniformity of the thickness of the oxide film, and it is possible to contribute to the lowering of a process temperature. In addition, since the combustion system for a wet oxidation process is utilized for heating the process gas, this is more advantageous to costs and space efficiency than a case where a dedicated heater is provided.

Referring to FIGS. 7 through 11, a preferred embodiment of a second invention provided by the present application will be described below.

Figure 7:
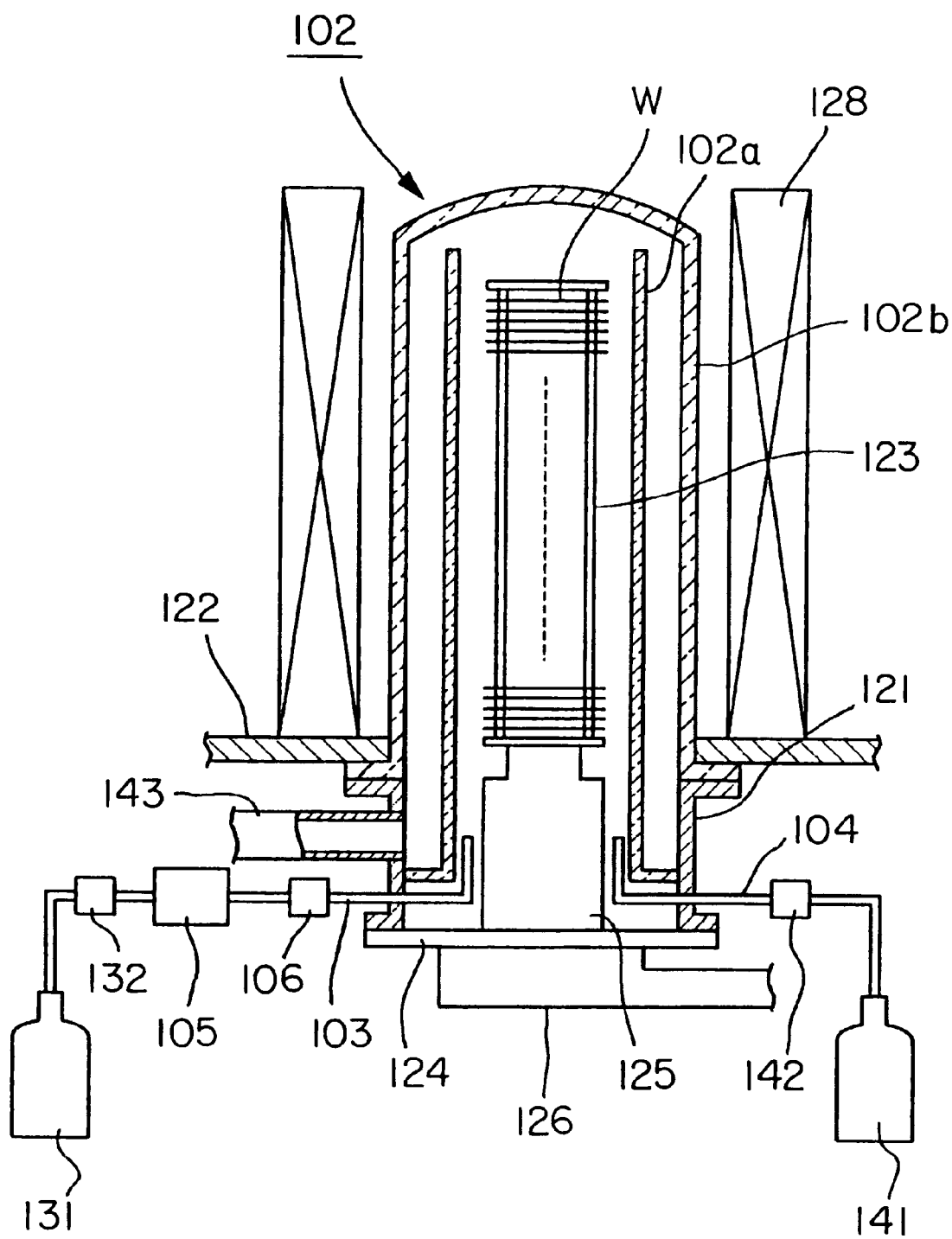
FIG. 7 is a longitudinal sectional view showing an example of a preferred embodiment of a vertical heat treatment system according to the present invention.

First, an example of a vertical heat treatment system for carrying out a method according to the present invention will be described. In FIG. 7, reference number 2 denotes a reaction tube having a double tube structure comprising an inner tube 102a and outer tube 102b of, e.g., quartz. The reaction tube 102 is provided with a cylindrical manifold of a metal on the bottom side.

The top end of the inner tube 102a is open, and the inner tube 102a is supported inside of the manifold 121. The top end of the outer tube 102b is closed, and the bottom end thereof is airtightly connected to the top end of the manifold 121. In this embodiment, the outer tube 102b and the manifold 121 constitute a reaction vessel. Reference number 22 denotes a base plate.

Figure 8:
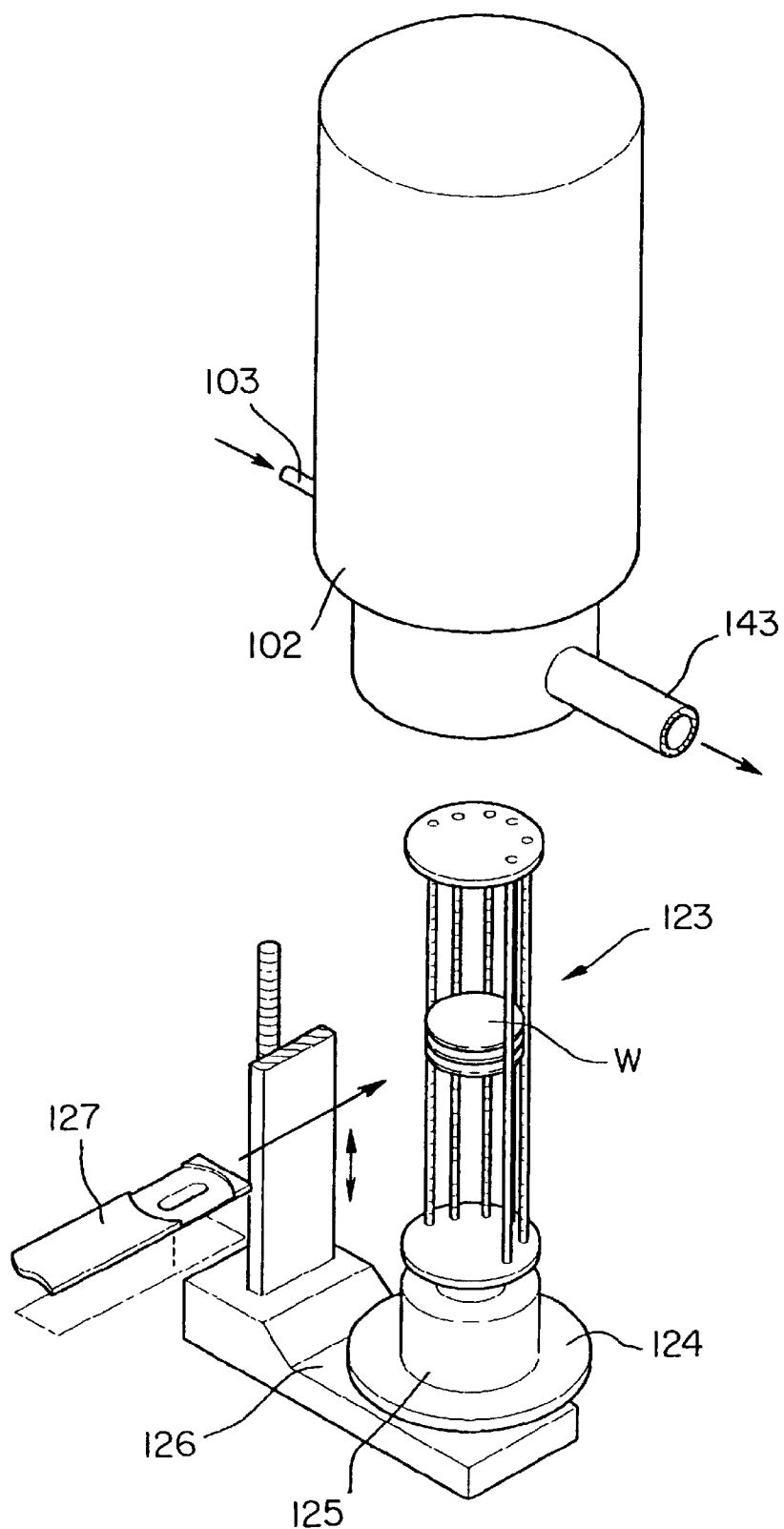
FIG. 8 is a perspective view showing a part of the vertical heat treatment system of FIG. 7.

For example, as shown in FIG. 8, in the reaction tube 102, a large number of, e.g., about 60, wafers W serving as objects to be treated are horizontally mounted on the shelves of a wafer boat 123 serving as a holder so as to be arranged at intervals in vertical directions. The wafer boat 123 is held on a lid 124 via a heat reserving cover (heat insulating member) 125. The lid 124 is mounted on a boat elevator 126 which is provided for carrying the wafer boat 123 in and out of the reaction tube 102. When the lid 124 is positioned at the upper limit position, the lid 124 serves to close a bottom end opening of the manifold 121, i.e., a bottom end opening of the reaction vessel constituted by the reaction tube 102 and the manifold 121. Furthermore, in FIG. 8, reference number 127 denotes a transfer arm for transferring the wafers W to the wafer boat 123.

Around the periphery of the reaction tube 102, a heater 128 serving as a heating means is provided so as to surround the reaction tube 102. The heater 128 comprises, e.g., a heating resistance member, and the temperature of the heater 128 is controlled by a control part, which will be described later, on the basis of a previously inputted temperature profile for a deposition process.

The manifold 121 is provided with a plurality of first gas feed pipes 103 serving as gas feed passages for supplying $N_2O$ (dinitrogen oxide) serving as a first process gas into the reaction tube 102, and a plurality of second gas feed pipes 104 for supplying $SiH_2Cl_2$ (dichlorosilane) serving as a second process gas into the reaction tube 102 so that the first and second gas feed pipes 103 and 104 are arranged at intervals in circumferential directions. The respective gases are fed into the reaction tube 102 from first and second gas supply sources 131 and 141, which are provided outside of the system, via the gas supply pipes 103 and 104.

In the first and second gas feed pipes 103 and 141, gas flow control parts 132 and 142 for controlling the flow rates of the gases are provided, respectively. The gas flow control parts 133 and 143 show portions including gas flow regulators and valves. In response to a control signal from the control part, the opening and closing timing is controlled on the basis of a previously inputted process gas feed program during a deposition process, so that the process gas feed timing is controlled. The manifold 121 is connected to an exhaust pipe 143 which is open between the inner tube 102a and the outer pipe 103b, so that the interior of the reaction tube 102 can be maintained in a predetermined reduced pressure atmosphere by an evacuating means (not shown).

Subsequently, a system for supplying $N_2O$ gas serving as a first process gas will be described. Downstream of the gas flow control part 131 of the first gas feed pipe 103, a heater 105 serving as a heating part for preheating $N_2O$ gas to a predetermined temperature, and an orifice 106 are provided so that the heater 105 is arranged upstream of the orifice 106.

Figure 9:
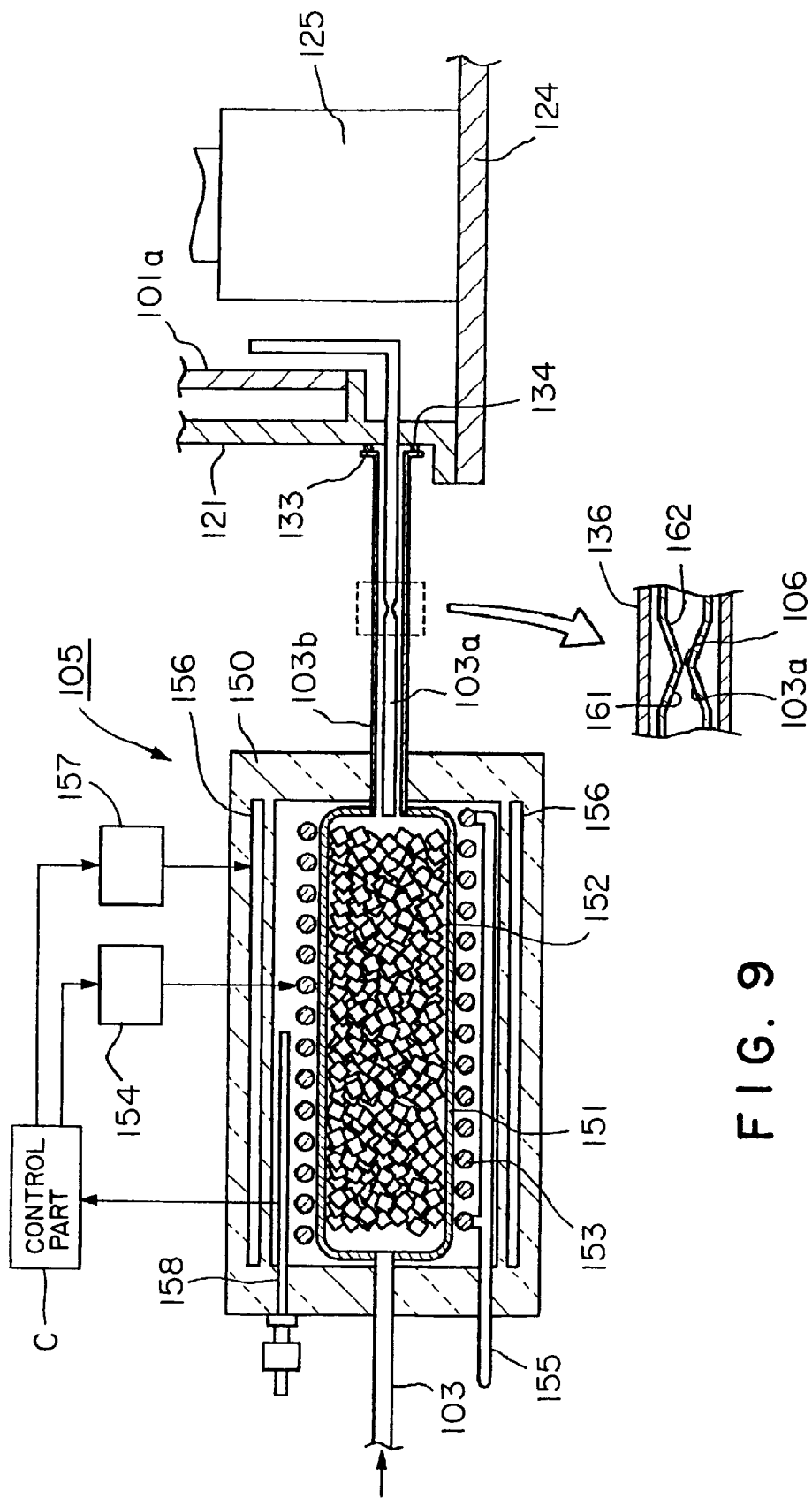
FIG. 9 is a sectional view showing a heater and an orifice for use in the vertical heat treatment system of FIG. 7.

For example, as shown in FIG. 9, the heater 105 is provided in the way of the first gas feed pipe 103 outside of the vertical heat treatment system. The heater 105 has a heating chamber 151 of, e.g., quarts, which is provided so as to block the first gas feed pipe 103. The heating chamber 151 comprises, e.g., a cylindrical heating tube having a greater inner diameter than that of the gas feed pipe 103, and is arranged so that its longitudinal direction is coincident with the gas ventilation direction. The heating chamber 151 is filled with a ventilation resistance material 152, e.g., a large number of transparent quarts cullets.

An example of the heating chamber 151 will be described below. For example, if the inner diameter of the first gas feed pipe 103 is 20 mm, the inner diameter of the heating chamber 151 is in the range of from 60 mm to 80 mm, and the length of the heating chamber 151 in ventilation directions is in the range of from about 100 mm to about 200 mm, and the size of the quarts cullets filled in the heating chamber 151 is in the range of from about $\phi 1$ to about $\phi 10$.

A heater element 151 serving as a heater part is spirally wound onto the outer periphery of the heating chamber 151 in ventilation directions. The heater element 153 is formed by spirally filling a string-like member, which is formed by knitting a plurality of bundles of fibers of a metal containing a small amount of metal impurities, e.g., thin carbon fibers having a diameter of about 10 microns, in a sealing member of a ceramic, e.g., in a quarts (e.g., transparent quarts) tube having an outer diameter of ten millimeters or more. The heater element 153 generates heat when it is energized. In the figure, reference number 154 denotes a power supply part for supplying power to the heater element, and reference number 155 denotes a sealing terminal.

The heating chamber 151 and the heater element 153 are covered with a heating body 150 of a cylindrical heat insulating member. For example,the heating body 150 is formed with a cooling jacket 156 for passing a refrigerant, e.g., cooling water, in ventilation directions along the heater element 153. Cooling water is supplied to the cooling jacket 156 from a cooling water supply part 157. For example, a temperature detecting part 158, e.g., a thermocouple, is provided between the cooling jacket 156 and the heater element 153 in the heating body 150. On the basis of the temperature thus detected by the thermocouple, a control part C outputs a control signal to the power supply part 154 and the cooling water supply part 157 to control the quantity of power supplied to the heater element 153 and the quantity of cooling water supplied to the cooling jacket 156, so that the temperature in the heating chamber 151 is adjusted to be a predetermined temperature by the interaction between the heating of the heater element 153 and the cooling of the cooling jacket 156.

Thus, in the heater 105, the heating chamber 151 serves as a heat exchanging part. By feeding a process gas into the heating chamber 151, the temperature of which has been adjusted to be a predetermined temperature, to allow the process gas to contact the ventilation resistance material 152, the process gas is preheated to a predetermined temperature.

A portion of the first gas feed pipe 103 downstream of the heating chamber 151 is formed as a double pipe comprising an inner pipe 103a and an outer pipe 103b, which is provided outside of the inner pipe 103a so as to be spaced from the inner pipe 103a. The other end of the outer pipe 103b, is bent to be formed as a flange portion 133, and connected to, e.g., the side wall of the manifold 121, via a sealing member 134 of a resin, e.g., an O-ring. On the other hand, as described above, the inner pipe 103a is inserted into the manifold as the first gas feed pipe 103. The process gas thus preheated by the heating chamber 151 passes through the inner pipe 103a to be fed into the reaction tube 102 via the orifice 106.

As shown in FIG. 9, the orifice 106 means a portion in which the diameter of the pipe suddenly decreases. In this embodiment, the inner diameter of the outer pipe 103b, does not vary, and only the inner diameter of the inner pipe 103a decreases. The inner diameter of the orifice 106 is set to be, e.g., about 1/50 to 1/2 as large as the inner diameter of the inner pipe 103a. Upstream and downstream of the orifice 106 of the inner pipe 103a, slope ways 161 and 162 for connecting the inner pipe 103a to the orifice 106 are provided. The inner diameter of the upstream slope way 161 gradually decreases to the orifice 106, and the inner diameter of the downstream slope way 162 gradually increases.

In an example of the orifice 106, when the inner diameter of the outer pipe 103b, of the double pipe downstream of the heating chamber 141 is in the range of from φ10 to φ18 and when the inner diameter of the inner pipe 103a is in the range of from φ2 to φ6, the inner diameter of the orifice 106 is in the range of from φ0.1 to φ2, the length of the orifice is in the range of from about 0.1 mm to about 1 mm, and the length of each of the upstream slope way 161 and downstream slope way 162 is in the range of from about 0.1 mm to about 1 mm.

As an example of a method according to the present invention which is carried out by the above described system, a method for forming an oxide film called HTO (High Temperature Oxide) film will be described below. For example, the HTO film is applied as a silicon oxide film used for a triple-layer structure which is called an O—N—O film provided between the floating gate and control gate of a flash memory and which comprises a silicon oxide film ($SiO_2$ film), a silicon nitride film ($Si_3N_4$ film) and a silicon oxide film ($SiO_2$ film).

Specifically, first, a large number of wafers W serving as objects to be treated are held on the shelves of the wafer boat 123 to be carried in the reaction tube 102 via the bottom end opening by moving the boat elevator 126 upwards. Then, the temperature in the process atmosphere is heated to a predetermined temperature of, e.g., 720° C., by the heater 128, and the bottom end opening of the manifold 121, i.e., the wafer carrying-in/out port of the reaction vessel, is airtightly closed by the lid 124. Then, the pressure in the reaction vessel is reduced in a heating atmosphere to a predetermined degree of vacuum, e.g., 0.1 Torr to 1 Torr, via the exhaust pipe 143 by the evacuating means (not shown).

On the other hand, in the heater 105, the heating chamber 151 is heated by the combination of the heating based on the heater element 153 with the cooling based on the passing of cooling water, to heat the ventilation resistance material 152 to a predetermined temperature, e.g., 500° C. to 900° C. Then, $N_2O$ gas serving as a first process gas is supplied into the heating chamber 151 from the gas supply source 131 via the gas feed pipe 103 at a predetermined flow rate, e.g., 100 sccm to 1000 sccm. At this time, the pressure in the reaction tube 102 has been reduced to about 0.1 Torr to about 1 Torr as described above. However, since the orifice 106 is formed between the heater 105 and the reaction tube 102, the pressure in the heating chamber 151 is, e.g., about 200 Torr to about 700 Torr, due to pressure loss at the orifice 106.

Thus, $N_2O$ gas is passed through the heating chamber, which has been heated to the predetermined temperature, to contact the ventilation resistance material 152, so that $N_2O$ gas is preheated to a temperature, at which $N_2O$ gas is activated without being decomposed, i.e., a temperature approximating to a decomposition temperature, e.g., 500° C. to 850° C., to be fed into the reaction tube 102 via the gas feed pipe 103a.

Thus, $N_2O$ gas serving as the first process gas and $SiH_2Cl_2$ gas serving as the second process gas are supplied into the reaction tube 102 (specifically the reaction vessel comprising the reaction tube 102 and the manifold 121) from the gas supply sources 131 and 141 via the gas feed pipes 103 and 104 at predetermined flow rates, respectively. Thus, while the pressure in the reaction tube 102 is, e.g., 0.1 Torr to 1 Torr, a silicon oxide film is formed on the surface of the wafer W.

At this time, by supplying the process gases, the silicon oxide film is deposited on the wafer W in accordance with the following reaction.

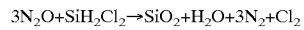

$$3N_2O+SiH_2Cl_2 \rightarrow SiO_2+H_2O+3N_2+Cl_2$$

After the process gases diffuse in the inner tube 102a of the reaction tube 102 to be supplied to the surface of the wafer W, which is mounted on the wafer boat 123, to rise to reach the top end portion of the inner tube 102a, the process gases drops a space between the inner tube 102a and the outer tube 102b to be exhausted from the exhaust pipe 143. Thus, the process gases are uniformly supplied to the wafer W mounted on the wafer boat 123, so that the silicon oxide film is formed on the wafer W.

After the predetermined deposition of the silicon oxide film is thus completed, the introduction of the process gases is stopped, and the surface temperature of the wafer W is dropped to a predetermined temperature. In addition, a purge gas, e.g., $N_2$ gas, is fed from, e.g., two of the gas feed pipes 103 and 104 which were used for feeding the process gases during deposition, so that the pressure in the reaction tube 102 is returned to atmospheric pressure. Then, the boat elevator 126 is moved downwards to open the carrying-in/out port formed in the bottom end of the reaction tube 102 to carry the wafer boat 123 out of the reaction tube 102.

According to such a preferred embodiment, the process gasses preheated by the heater 105 are supplied to the reaction tube 102, so that it is possible to carry out a deposition process having a high inplane uniformity even if a so-called low temperature process at a low process temperature in the reaction tube 102 is carried out. That is, as described in "Description of Related Art", the temperature of the central portion of the wafer W is higher than the temperature of the peripheral portion thereof, and the process gases flow from the peripheral portion of the wafer W toward the central portion thereof. Therefore, if the process temperature is lowered to about 720° C. from a conventional process temperature of 750° C. to 830° C., the deposition gases, in which the deposition reaction does not so proceed, i.e., the degree of decomposition is small, are supplied to the peripheral portion of the wafer. On the other hand, the process gases, in which the deposition reaction proceeds, i.e., the degree of decomposition is large, are supplied to the central portion of the wafer since the temperature and concentration of the gases are higher than those in the peripheral portion. Thus, the deposition reaction is easier to proceed in the central portion of the wafer W than the peripheral portion thereof, so that the thickness of the formed film in the central portion is larger than that in the peripheral portion.

On the other hand, according to the present invention, if the process gases preheated by the heater 105 to a temperature, at which the process gases are decomposed to an extent that the decomposition reaction does not proceed, e.g., a temperature approximating the decomposition temperature, are fed into the reaction tube 102, even if the process temperature in the reaction tube 102 is a low temperature of about 720° C., the process gases fed into the reaction tube 102 are heated to a higher temperature than the decomposition temperature until the process gases reach the peripheral portion of the wafer, so that the process gases, in which the decomposition reaction has sufficiently proceeded, are supplied to the peripheral portion of the wafer, since the process gases have been preheated to the temperature approximating to the decomposition temperature.

Since the process gases having substantially the same degree of decomposition are thus supplied to the peripheral and central portions of the wafer W, the deposition reaction substantially proceeds in the same state over the whole surface of the wafer W, so that it is possible to ensure the high inplane uniformity of the thickness of the formed film.

In the heater 105 for preheating the process gases, the heating chamber 151 is provided with the ventilation resistance material 152 for heating the process gases while allowing the process gases to contact the ventilation resistance material 152, so that it is possible to efficiently raise the temperature of the process gases. That is, the heating chamber 151 is filled with the ventilation resistance material 152, so that the process gases pass through the heating chamber 151 while contacting the ventilation resistance material 152. Therefore, the residence time of the process gases increases, so that the process gases are heated by the combination of the heating based on the convection of the process gases themselves heated by the heater element 153, with the heating based on the heat transfer from the ventilation resistance material 152.

When the heating chamber 151 is filled with quarts cullets having a size of about $\phi 1$ to about $\phi 10$ as the ventilation resistance material 152, the whole surface area of the quarts cullets 152 is large, so that it is possible to ensure the large heat transfer area to more efficiently raise the temperature of the process gases.

Since the process gas feed pipe 103 is provided with the orifice 106 between the heater 105 and the reaction tube 102, it is possible to sufficiently heat the process gases to a predetermined temperature even if a low pressure process is carried out in the reaction vessel. That is, since pressure loss occurs in the orifice 106, the pressure on the upstream side is higher than the pressure on the downstream side. Thus, even if the pressure in the reaction vessel 102 is reduced to, e.g., about 0.1 Torr to about 1 Torr, the pressure in the heating chamber 151 upstream of the orifice 106 is, e.g., about 200 Torr to about 700 Torr. On the other hand, if the orifice 106 is not provided, when the pressure in the reaction vessel 102 is reduced to, e.g., about 0.1 Torr to about 1 Torr, the pressure in the heating chamber 151 is, e.g., about 0.2 Torr to about 1 Torr.

Thus, since the degree of reduced pressure is decreased by providing the orifice 106, although convection is difficult to occur in the heating chamber 151, its degree is small. In addition, the partial pressures of the process gases in the heating chamber 151 increase. Therefore, as compared with a case where the orifice 106 is not provided, the heat conduction due to convection of the process gases in the heating chamber 105 is easy to occur. Thus, since heat is sufficiently transferred to the interior of the heater 105, the efficiency of heat transfer to the process gases is improved, so that it is possible to heat the process gases to a predetermined temperature in a short time and it is possible to realize a low temperature process.

Using the same heat treatment system as that in the above described preferred embodiment, the pressure in the reaction tube 102 was set to be 0.1 to 1 Torr, the process temperature in the reaction tube 102 was set to be 720° C., and the temperature in the heating chamber 151 was set to be 500° C. to 900° C. In addition, $N_2O$ gas and $SiH_2Cl_2$ were fed into the system at a flow rate of about 100 sccm to about 1000 sccm and at a flow rate of about 100 sccm to about 300 sccm, respectively, to carry out a deposition process. The inplane uniformity of the thickness of a silicon oxide film thus formed on the wafer W was measured by a thickness measuring apparatus (ellipsometer). As a result, it was confirmed that it was possible to sufficiently preheat $N_2O$ gas by passing $N_2O$ gas into the heating chamber 151 at the above described flow rate and that it was possible to realize the high uniformity of the thickness of the formed film even in a low temperature process.

Moreover, since the downstream side of the heater 105 is a double pipe, the following effects are obtained. That is, when the heating chamber 151 is connected to the reaction tube 102 by means of a gas feed pipe of a single pipe, the end portion of the single pipe is formed as a flange, and both are connected via a sealing member (O-ring) of a resin provided between the flange and the reaction tube 102. With such a construction, the temperature of the process gases leaving the heating chamber 151 is a high temperature of, e.g., about 450° C. to about 850° C., so that the gas feed passage is heated by passing the process gases. Thus, the temperature of the flange is a higher temperature than a heat resisting temperature of the sealing member of the resin, e.g., 250° C. By the heat of the flange, the sealing member 134 of the resin is deformed, so that there is the possibility that gastightness may deteriorate.

On the other hand, when the double pipe is used according to the present invention, the process gases pass through the inner pipe 103a, so that the process gases do not contact the outer pipe 103b. Thus, heat conduction due to contact with the process gases does not occur in the outer pipe 103b, so that the temperature in the outer pipe 103b, does not so rise as compared with the inner pipe 103a. Therefore, if the flange 133 is formed by the outer pipe 103b, and if the flange 133 is connected to the reaction pipe 102 via the sealing member 134 of the resin, the temperature in the outer pipe does not exceed the heat resisting temperature of the sealing member 134 of the resin. Therefore, there is not the possibility that the sealing member 134 of the resin is deformed by heat of the flange 133, so that it is possible to enhance reliability.

If the gas feed pipe 103 comprises the double pipe, the outer pipe 103b, is arranged between the inner pipe 103a, through which gases pass, and outside air to prevent the inner pipe 103a from contacting outside air, so that the degree of cooling of the inner pipe 103a due to outside air decreases. Thus, since radiation quantity decreases when the heated process gases pass through the inner pipe 103a, the temperature drop of the process gases is suppressed, so that it is possible to feed the process gases into the reaction tube 102 while holding the state activated by the preheating.

Figure 10A:
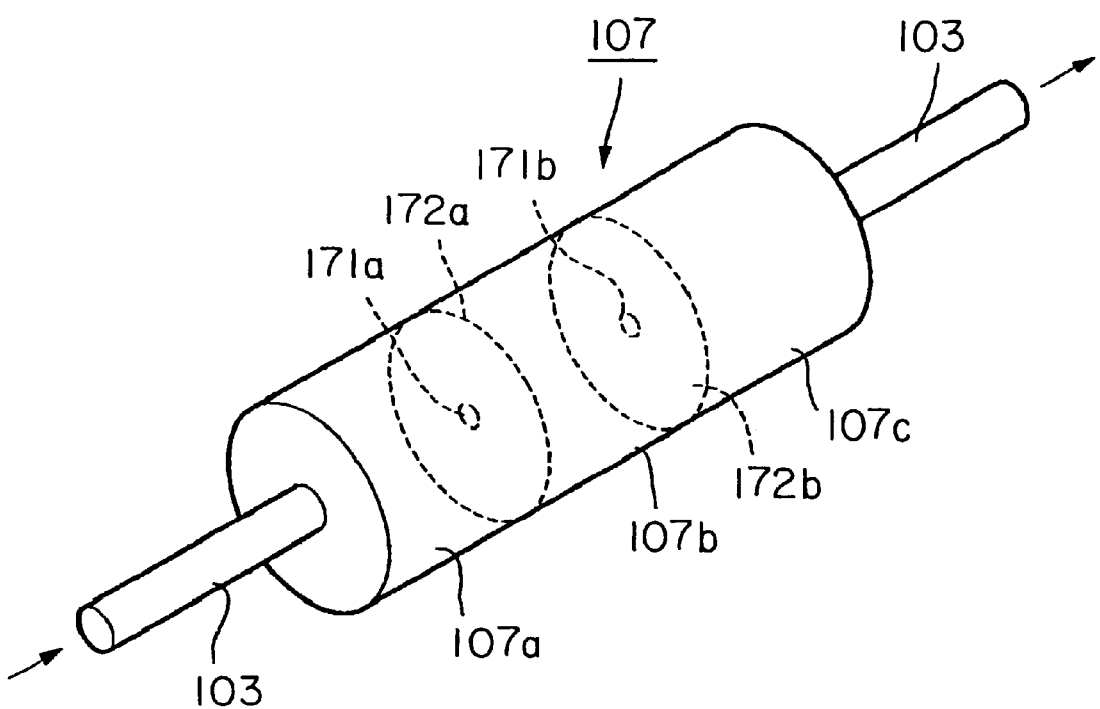
FIGS. 10(a) and 10(b) are perspective and sectional views showing a gas chamber for use in another preferred embodiment of a vertical heat treatment system according to the present invention.
Figure 10B:
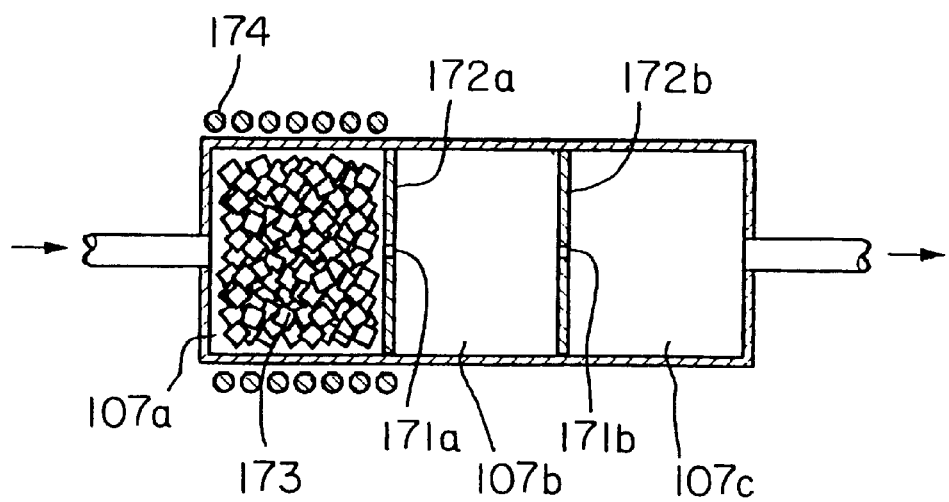
Figure 11:
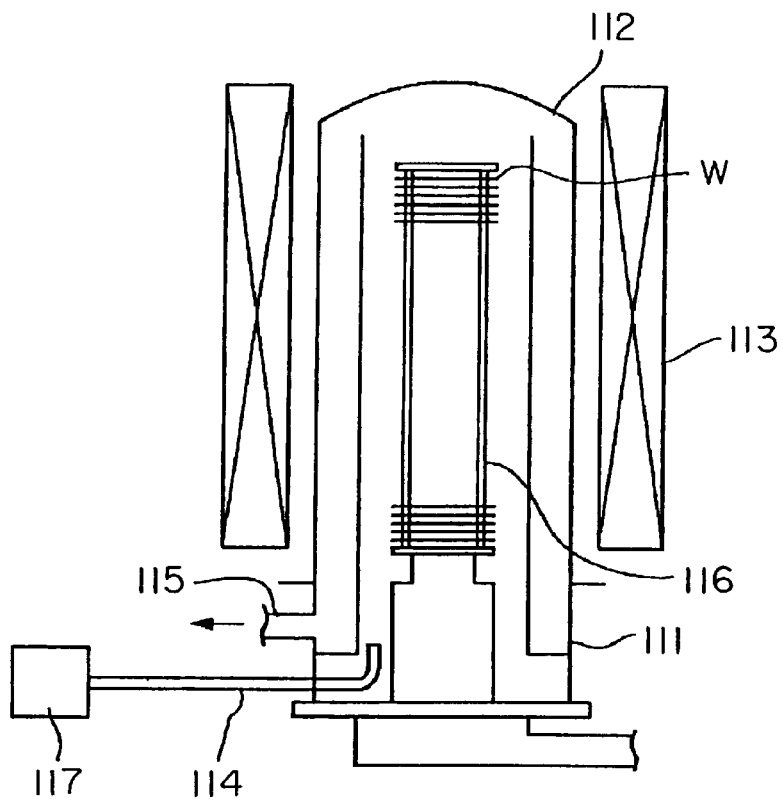
FIG. 11 is a sectional view showing a conventional vertical heat treatment system.
Figure 12:
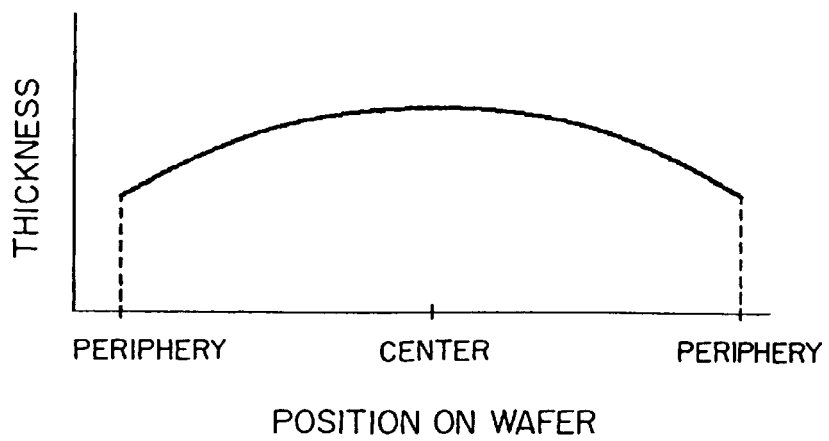
FIG. 12 is a characteristic diagram showing the relationship between thickness and position on a wafer.

Referring to FIGS. 10 and 11, another preferred embodiment will be described below. In this embodiment, a gas feed passage (first gas feed pipe 103) is provided with a gas chamber 107, which comprises a combination of a heating chamber with an orifice, so as to block the gas feed passage. The gas chamber 107 has three compartments 107a, 107b and 107c which are arranged in ventilation directions. These compartments 107a through 107c are separated by partition walls 172a and 172b having vent holes 171a and 171b which serve as orifices and which have a smaller inner diameter than that of the first gas feed pipe 103. Each of the upstream first compartment 107a and the downstream third compartment 107c is connected to the first gas feed pipe 103, and the second compartment 107b is provided between the first compartment 107a and the third compartment 107c.

The first compartment 107a is formed as a heating chamber, and is filled with a ventilation resistance material 173 of, e.g., beads-like cullets, and a heater element 174 serving as a heater part is wound onto the first compartment 107a, as shown in FIG. 10(b). The ventilation resistance material 173 and the heater element 174 are the same as those in the above described preferred embodiment.

In such a construction, the second compartment 107b and the third compartment 107c are provided adjacent to the heating chamber 107a, and the orifices 171a and 171b are provided in the connection portions therebetween. Therefore, if the pressure in the reaction tube 107a is reduced, the pressures in the first compartment 107a, second compartment 107b and third compartment 107c are decreased in that order due to pressure loss at the orifices. Therefore, since the degree of reduced pressure in the first compartment 107a is minimum, convection sufficiently occurs in this compartment 107a, and heat is sufficiently transferred to the interior of the heating chamber, so that it is possible to improve the heating efficiency of the process gases and it is possible to sufficiently heat the gases to a predetermined temperature.

In the above described embodiment, in the heating chambers 151 and 107a, the process gases may be heated by the convection of the process gases without filling the ventilation resistance materials 152 and 173 therein. The ventilation resistance materials 152 and 173 may be foam quartz or porous SiC in addition to quarts cullets.

In the above described embodiment, the decomposition temperature of $SiH_2Cl_2$ serving as a second gas is lower than that of $N_2O$ gas, and the decomposition reaction sufficiently occurs by the heating in the reaction tube 102 even if preheating is not carried out, so that only $N_2O$ gas serving as the first process gas is preheated. However, $SiH_2Cl_2$ gas may be preheated.

The present invention can not only be applied to the low pressure CVD process, but the invention can also be applied to an atmospheric pressure process for causing, e.g., the following reaction using HCl (hydrogen chloride) gas and $O_2$ (oxygen) gas as process gases.

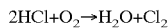

The system to which the present invention can be applied should not be limited to the above described batch type vertical heat treatment system, the invention can be effectively applied to a case where a single wafer heat treatment system is used for depositing a thin film. Also in this case, it is possible to carry out a high uniformity process. The present invention can not only be applied to the deposition of a silicon oxide film, but the invention can also be applied to the deposition of a polysilicon film, a silicon oxide film based on TEOS, and a silicon nitride film. The present invention can also be applied to the deposition of an oxide film in dry oxidation, wet oxidation and HCl oxidation processes other than a CVD deposition process.

As described above, according to the second invention provided by the present application, the process gas is supplied to the reaction vessel after the process gas is preheated to a predetermined temperature by the heating part which is provided outside of the reaction vessel, so that it is possible to lower the process temperature while ensuring the uniformity of the process. In this case, even if the low pressure process is carried out, if the orifice is provided between the heating part and the reaction, it is possible to decrease the degree of reduced pressure in the heating part, and it is possible to efficiently heat the process gas in the heating part.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A heat treatment system wherein an object to be treated is carried in a reaction vessel, which has been pressure-reduced to a predetermined degree of vacuum by evacuating means and the interior of which is heated to a predetermined process temperature, and a process gas is supplied into said reaction vessel via a gas feed passage to process said object, said heat treatment system comprising:

a heating part, provided in said gas feed passage, for heating said process gas to a predetermined temperature before said process gas is supplied to said reaction vessel; and an orifice formed in said gas feed passage between said heating part and said reaction vessel, wherein while the pressure in said heating part is higher than the pressure in said reaction vessel due to pressure loss at the orifice, said process gas is supplied into said heating part via said gas feed passage to preheat said process gas to a predetermined temperature to supply the preheated process gas to said reaction vessel.

2. A heat treatment system wherein an object to be treated is carried in a reaction vessel, the interior of which is heated to a predetermined process temperature, and a process gas is supplied into said reaction vessel via a gas feed passage to process said object, said heat treatment system comprising:

a heating part, provided in said gas feed passage, for heating said process gas to a predetermined temperature before said process gas is supplied to said reaction vessel, wherein said gas feed passage arranged between said heating part and said reaction vessel comprise a double pipe comprising an inner pipe and an outer pipe which is provided outside of said inner pipe so as to be spaced from said inner pipe, and wherein said process gas is supplied into said heating part via said gas feed passage to be preheated to a predetermined temperature to be supplied to said reaction vessel via said gas feed passage.

3. A heat treatment system as set forth in claim 2, wherein said outer pipe of said double pipe of said gas feed passage is bent to form a flange which is connected to said reaction vessel via a sealing member.

4. A heat treatment system as set forth in claim 2, which further comprises:

evacuating means for reducing the pressure in said reaction vessel to a predetermined degree of vacuum; and an orifice formed in said inner pipe of said gas feed passage between said heating part and said reaction vessel, wherein while the pressure in said heating part is higher than the pressure in said reaction vessel due to pressure loss at the orifice, said process gas is supplied into said heating part via said gas feed passage to preheat said process gas to a predetermined temperature to supply the preheated process gas to said reaction vessel.

5. A heat treatment system as set forth in claim 1 or 2, wherein said heating part comprises a heating chamber for heating said process gas, and a heater part provided so as to surround said heating chamber for heating said heating chamber.

6. A heat treatment system as set forth in any one of claims 1 and 2, wherein said heat treatment system is a vertical heat treatment system wherein a large number of objects to be treated are held on the shelves of a holder to be carried in said reaction vessel, and the interior of said reaction vessel is heated to a predetermined process temperature by heating means which surrounds said reaction vessel.

7. A heat treatment system as set forth in claim 1 or 2, wherein a ventilation resistance material is provided in said heating chamber, said ventilation resistance material contacting said process gas to preheat said process gas to a predetermined temperature.

8. A heat treatment system as set forth in claim 1 or 2, wherein said process gas is preheated in said heating chamber to a temperature at which said process gas is activated to an extent that said process gas is decomposed.

9. A heat treatment system as set forth in claim 1 or 2, wherein said heater part comprises a resistance heating element which has a small amount of metal impurities and which is filled in a ceramic.

10. A heat treatment system as set forth in claim 9, wherein said resistance heating element is made of a high purity carbon material.

11. A heat treatment system as set forth in claim 9, wherein said ceramic is quartz.

12. A heat treatment method for processing an object to be treated, in a reaction vessel, which has been pressure-reduced to a predetermined degree of vacuum, by supplying a process gas into said reaction vessel while heating said object, said method comprising the steps of:

supplying said process gas to a heating part, which is provided outside of said reaction vessel, to preheat said process gas; and feeding the preheated process gas into said reaction vessel, wherein said step of preheating said process gas is carried out while the pressure in said heating part is higher than the pressure in said reaction vessel due to pressure loss at an orifice which is formed in a gas feed passage provided between said heating part and said reaction vessel and which has a smaller inner diameter than that of said gas feed passage.

* * * * *